(12) United States Patent
You et al.

(10) Patent No.: US 12,336,304 B2
(45) Date of Patent: Jun. 17, 2025

(54) ZINC OXIDE-CRYSTALLINE SILICON LAMINATED SOLAR CELL AND PREPARATION METHOD THEREOF

(71) Applicant: Dai Qi You, Sichuan (CN)

(72) Inventors: Dai Qi You, Mianyang (CN); Liu De Xiong, Mianyang (CN); Wen Cai, Mianyang (CN)

(73) Assignee: Qiyou Dai, Mianyang (CN)

( * ) Notice: Subject to any disclaimer, the term of this patent is extended or adjusted under 35 U.S.C. 154(b) by 0 days.

(21) Appl. No.: 18/549,675

(22) PCT Filed: Mar. 16, 2023

(86) PCT No.: PCT/CN2023/081935
§ 371 (c)(1),
(2) Date: Sep. 8, 2023

(87) PCT Pub. No.: WO2024/001312
PCT Pub. Date: Jan. 4, 2024

(65) Prior Publication Data
US 2024/0322060 A1   Sep. 26, 2024

(30) Foreign Application Priority Data
Jun. 28, 2022   (CN) .......................... 202210745683.8

(51) Int. Cl.
*H10F 71/10*   (2025.01)
*H10F 10/162*   (2025.01)
(Continued)

(52) U.S. Cl.
CPC .......... *H10F 10/162* (2025.01); *H10F 71/10* (2025.01); *H10F 71/1257* (2025.01); *H10F 77/211* (2025.01); *H10F 77/315* (2025.01)

(58) Field of Classification Search
CPC ......... H01L 31/02168; H01L 31/02167; H01L 31/022425; H01L 31/073; H01L 31/1868;
(Continued)

(56) References Cited

U.S. PATENT DOCUMENTS

2019/0157475 A1* 5/2019 Sato ................ H01L 31/022425
2020/0127149 A1* 4/2020 Lin ................. H01L 31/022441
2020/0212242 A1* 7/2020 Fang ..................... C23C 16/403

FOREIGN PATENT DOCUMENTS

CN           209561421 U        10/2019
CN           114059041 A   *    2/2022

OTHER PUBLICATIONS

Yan L, Uddin A, Wang H. ZnO Tetrapods: Synthesis and Applications in Solar Cells. Nanomaterials and Nanotechnology. 2015;5. doi:10.5772/60939 (Year: 2015).*
(Continued)

*Primary Examiner* — Mayla Gonzalez Ramos
(74) *Attorney, Agent, or Firm* — Westbridge IP LLC (57) ABSTRACT

The present application discloses a zinc oxide-crystalline silicon laminated solar cell and a preparation method thereof, relates to the technical field of solar cells, and aims to solve the technical problem of low photoelectric conversion rate of existing solar cells. The zinc oxide-crystalline silicon laminated solar cell includes: a P-type silicon substrate layer; a front surface of the P-type silicon substrate layer being sequentially formed with, from bottom to top, a diffusion layer, an N-type zinc oxide layer, a first passivation layer, and a first antireflection layer; wherein the N-type zinc oxide layer is made of tetrapod-like N-type zinc oxide whisker powder as a raw material; and a back surface of the P-type silicon substrate layer being sequentially formed with, from top to bottom, a second passivation layer and a
(Continued)

second antireflection layer; and an electrode, the electrode including a front electrode and a back electrode.

13 Claims, 6 Drawing Sheets

(51) Int. Cl.
*H10F 71/00* (2025.01)
*H10F 77/20* (2025.01)
*H10F 77/30* (2025.01)

(58) Field of Classification Search
CPC .... H10F 10/162; H10F 71/10; H10F 71/1257; H10F 77/211; H10F 77/315
See application file for complete search history.

(56) References Cited

OTHER PUBLICATIONS

Machine translation of CN-114059041-A, Li et al. (Year: 2022).*
Machine translation of CN 114059041 A, Li R. (Year: 2022).*
"ZnO Tetrapods: Synthesis and Applications in Solar Cells", Luting Yan, Ashraf Uddin, and Haiwei Wang, Nanomaterials and Nanotechnologyvol. 5, Jan. 2015. (Year: 2015).*

* cited by examiner

ZINC OXIDE-CRYSTALLINE SILICON LAMINATED SOLAR CELL AND PREPARATION METHOD THEREOF

TECHNICAL FIELD

The present application relates to the technical field of solar cells, and in particular, to a zinc oxide-crystalline silicon laminated solar cell and a preparation method thereof.

BACKGROUND

Conventional fossil fuels are becoming increasingly depleted, and among existing sustainable energy sources, solar energy is undoubtedly a clean, universal, and highly potential alternative energy source. Solar cells, also known as photovoltaic cells, are semiconductor devices that directly convert the solar energy into electrical energy. As solar cells are green and environmentally friendly products, and the solar energy is a renewable resource, in current situation of energy shortage, the solar cells are a new type of energy source with broad development prospects and have received widespread attention. However, the photoelectric conversion rate of existing solar cells is relatively low.

SUMMARY OF THE INVENTION

A main purpose of the present application is providing a zinc oxide-crystalline silicon laminated solar cell and a preparation method thereof, aiming to solve the technical problem of the low photoelectric conversion rate of existing solar cells.

To solve the above technical problem, embodiments of the present application propose a zinc oxide-crystalline silicon laminated solar cell, including:
  a P-type silicon substrate layer;
  a front surface of the P-type silicon substrate layer being sequentially formed with, from bottom to top, a diffusion layer, an N-type zinc oxide layer, a first passivation layer, and a first antireflection layer; wherein the N-type zinc oxide layer is made of tetrapod-like N-type zinc oxide whisker powder as a raw material; and
  a back surface of the P-type silicon substrate layer being sequentially formed with, from top to bottom, a second passivation layer and a second antireflection layer; and
  an electrode, the electrode including a front electrode and a back electrode.

As some optional implementations of the present application, the thickness of the N-type zinc oxide layer is 0.1-50 µm.

As some optional implementations of the present application, the front electrode includes a silver gate electrode; and the back electrode includes an aluminum gate electrode.

As some optional implementations of the present application, the first antireflection layer includes a silicon nitride antireflection layer; and the second antireflection layer includes a silicon nitride antireflection layer.

As some optional implementations of the present application, the first passivation layer includes at least one of an aluminum oxide passivation layer and a silicon nitride passivation layer; and the second passivation layer includes at least one of an aluminum oxide passivation layer and a silicon nitride passivation layer.

As some optional implementations of the present application, the diffusion layer includes an N-type diffusion layer.

To solve the above technical problem, the present application further provides a preparation method of the zinc oxide-crystalline silicon laminated solar cell, including the following steps:
  diffusing a phosphorus impurity on a front surface of a P-type silicon substrate layer to form a diffusion layer, and performing an edge insulation treatment; then magnetron sputtering tetrapod-like N-type zinc oxide whisker powder as a raw material on an upper surface of the diffusion layer to form an N-type zinc oxide layer, and forming a first passivation layer and a first antireflection layer on an upper surface of the N-type zinc oxide layer;
  depositing a second passivation layer and a second antireflection layer sequentially on a back surface of the P-type silicon substrate layer;
  screen printing a front electrode on an upper surface of the first antireflection layer, and screen printing a back electrode on a lower surface of the second antireflection layer; and
  using a sintering process so that the front electrode and the back electrode form ohmic contact with the P-type silicon substrate layer to obtain the zinc oxide-crystalline silicon laminated solar cell.

As some optional implementations of the present application, the diffusing phosphorus impurity on the front surface of the P-type silicon substrate layer to form the diffusion layer, and performing the edge insulation treatment; then growing the N-type zinc oxide layer by using tetrapod-like zinc oxide whisker powder as the raw material on the upper surface of the diffusion layer, and sequentially forming the first passivation layer and the first antireflection layer on the upper surface of the N-type zinc oxide layer includes:
  diffusing the phosphorus impurity on the front surface of the P-type silicon substrate layer to form the diffusion layer, and performing the edge insulation treatment; then growing the N-type zinc oxide layer by magnetron sputtering the tetrapod-like N-type zinc oxide whisker powder as the raw material on the upper surface of the diffusion layer and performing annealing treatment on the N-type zinc oxide layer, and then sequentially forming the first passivation layer and the first antireflection layer on the upper surface of the N-type zinc oxide layer.

As some optional implementations of the present application, sputtering energy is 80-250 W, a pressure range of a working gas argon is 0.4-1.6 Pa, and sputtering time is 15-20 min when growing the N-type zinc oxide layer by magnetron sputtering the tetrapod-like N-type zinc oxide whisker powder as the raw material on the upper surface of the diffusion layer.

As some optional implementations of the present application, during annealing of the N-type zinc oxide layer, the annealing temperature is 100-600° C., and the annealing time is 1-60 min.

As some optional implementations of the present application, the tetrapod-like N-type zinc oxide whisker powder is prepared by the following steps:
  preheating montmorillonite to 500-1100° C., mixing it with a zinc raw material according to a mass ratio of (8-12):(2-5), and then placing the mixture in a reaction furnace for a non-metallic ion exchange reaction to obtain the tetrapod-like N-type zinc oxide whisker powder.

As some optional implementations of the present application, oxygen and nitrogen are charged into the reaction furnace when the montmorillonite is subjected to the non-metallic ion exchange reaction with the zinc raw material, and a volume ratio of the oxygen to nitrogen is (2-5):(5-8).

As some optional implementations of the present application, the reaction temperature of the non-metallic ion exchange reaction is 600-1100° C., and the reaction time is 10-25 min; wherein oxygen and nitrogen are introduced into the reaction furnace when the reaction lasts for 7 min.

As some optional implementations of the present application, the non-metallic ion exchange reaction includes the following steps:

mixing the preheated montmorillonite with the zinc raw material and placing the mixture in the reaction furnace, and heating to 600-700° C. to obtain dehydrated montmorillonite;

heating to 800-935° C. to obtain montmorillonite with destroyed lattice;

heating to 935-1,100° C. so that the montmorillonite with destroyed lattice is subjected to the non-metallic ion exchange reaction with the zinc raw material, and obtaining the tetrapod-like N-type zinc oxide whisker powder.

To solve the above technical problem, the present application further provides use of the zinc oxide-crystalline silicon laminated solar cell as described above, wherein the zinc oxide-crystalline silicon laminated solar cell is used for manufacturing a photovoltaic charging station; or the zinc oxide-crystalline silicon laminated solar cell is used for manufacturing a photovoltaic powered vehicle.

As can be seen, compared with existing crystalline silicon solar cells which can only absorb visible spectral energy of 0.40-0.76 μm, in addition to the P-type silicon substrate layer, the diffusion layer, the first passivation layer, the first antireflection layer, the second passivation layer, the second antireflection layer, and the electrode, the structural layer of the solar cell described in the present application further includes the N-type zinc oxide layer made of the tetrapod-like N-type zinc oxide whisker powder for absorbing ultraviolet spectral energy; so that the absorbed ultraviolet spectral energy is converted into an external current through a PN junction of the silicon substrate layer and the metal electrode. The tetrapod-like N-type zinc oxide whisker is a self-activated direct wide band gap inorganic semiconductor material with a lead-zinc ore structure, which has a regular three-dimensional spatial structure, a white loose powder appearance, and a three-dimensional microstructure, that is, the whisker has a core, and four needle-like crystals extend from radial directions of the core. It is currently the only material having a spatial three-dimensional structure among all whiskers. Due to their unique tetrapod-like three-dimensional structure, when applied in the field of solar cells, the tetrapod-like zinc oxide whiskers disperse in the matrix and then adjacent needle-like parts are overlapped with each other to form conductive pathways, thereby effectively endowing the material with conductivity and electrical transport performance.

In addition, due to the unique structure of the tetrapod-like zinc oxide whiskers, the solar cell described in the present application can greatly increase the light absorption and photoelectric conversion efficiency of the spectrum of 200-400 nm after being added with the N-type zinc oxide layer; however, it also faces problems such as difficulty in optimizing the surface contact performance between the N-type zinc oxide layer and the N-type silicon layer, and the zinc oxide layer being affected by subsequent alloy temperatures. Therefore, the substrate layer in the present application adopts a P-type silicon substrate, and the solar cell structure is designed to a zinc oxide-crystalline silicon laminated solar cell, which includes a P-type silicon substrate layer; a front surface of the P-type silicon substrate layer being sequentially formed with, from bottom to top, a diffusion layer, an N-type zinc oxide layer, a first passivation layer, and a first antireflection layer; wherein the N-type zinc oxide layer is made of tetrapod-like N-type zinc oxide whisker powder as a raw material; a back surface of the P-type silicon substrate layer being sequentially formed with, from top to bottom, a second passivation layer and a second antireflection layer; and an electrode, the electrode including a front electrode and a back electrode. This structure avoids problems such as the zinc oxide layer being affected by subsequent alloy temperatures.

As can be seen, the absorption efficiency of the tetrapod-like N-type zinc oxide whisker in the present application for ultraviolet spectral energy is much higher than that of silicon in traditional solar cells. Through the above structural improvement, the laminated solar cell described in the present application can not only absorb visible light at 400-780 nm, but also effectively absorb ultraviolet light at 200-400 nm. Additionally, an absorption rate of the solar cell described in the present application for light of 0.2-1 μm is greater than 90%, and therefore, compared with the existing crystalline silicon solar cells, the solar cell described in the present application significantly improves the photoelectric conversion rate of the solar cell.

DETAILED DESCRIPTION

It should be understood that, the described specific embodiments are merely used to explain the present application, and are not intended to limit the present application.

Conventional fossil fuels are becoming increasingly depleted, and among existing sustainable energy sources, solar energy is undoubtedly a clean, universal, and highly potential alternative energy source. Solar cells, also known as photovoltaic cells, are semiconductor devices that directly convert the solar energy into electrical energy. As solar cells are green and environmentally friendly products, will not cause environmental pollution, and solar energy is a renewable resource, in current situation of energy shortage, the solar cells are a new type of energy source with broad development prospects and have received widespread attention. However, the photoelectric conversion rate of existing solar cells is relatively low.

A main purpose of the present application is providing a zinc oxide-crystalline silicon laminated solar cell and a preparation method thereof, aiming to solve the technical problem of the low photoelectric conversion rate of existing solar cells.

Figure 6:
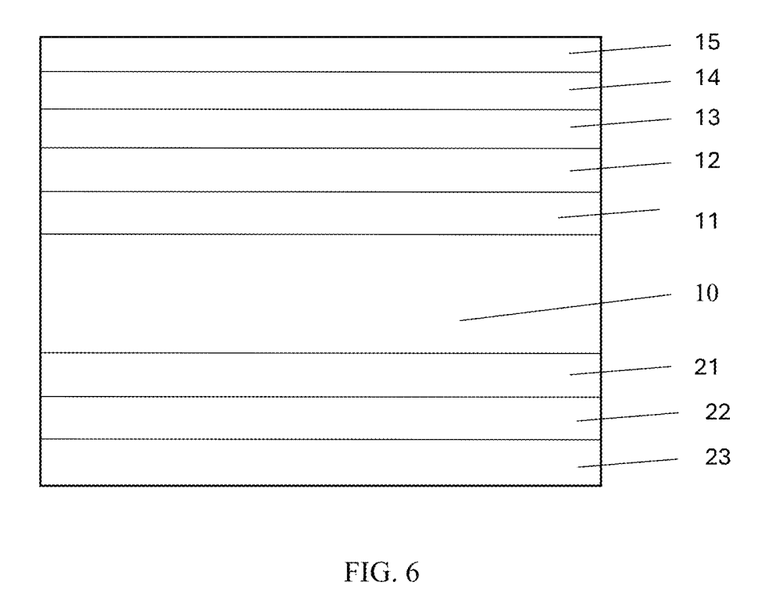
FIG. 6 is a schematic structural diagram of the zinc oxide-crystalline silicon laminated solar cell according to an embodiment of the present application.

To solve the above technical problem, referring to FIG. 6, embodiments of the present application propose a zinc oxide-crystalline silicon laminated solar cell, including:

a P-type silicon substrate layer 10, a front surface of the P-type silicon substrate layer 10 being sequentially formed with, from bottom to top, a diffusion layer 11, an N-type zinc oxide layer 12, a first passivation layer 13, and a first antireflection layer 14; wherein the N-type zinc oxide layer 12 is made of tetrapod-like N-type zinc oxide whisker powder as a raw material; and a back surface of the P-type silicon substrate layer 10 being sequentially formed with, from top to bottom, a second passivation layer 21 and a second antireflection layer 22; and an electrode, the electrode including a front electrode 15 and a back electrode 23.

In a specific application, the substrate layer 10 serves as a carrier for a solar cell. When selecting a substrate layer material, in addition to considering economic cost and ease of source, consideration may also be based on conductivity type, resistivity, crystal phase, dislocation, lifespan, shape, size, and thickness. In a specific application, due to a longer diffusion coefficient and distance of minority carrier electrons in a P-type silicon substrate layer compared with minority carrier holes in the N-type. In order to obtain better photocurrent, the P-type silicon substrate layer 10 is a preferred substrate layer in the present application to ensure the absorption of visible light at 400-780 nm by the solar cell. Of course, the substrate layer 10 may also be selected according to actual needs, such as an N-type silicon substrate layer. The thickness of the substrate layer 10 may be selected according to the actual needs, such as 0.2 mm.

As can be seen, compared with existing silicon solar cells which can only absorb visible spectral energy of 0.40-0.76 μm, in addition to the P-type silicon substrate layer 10, the diffusion layer 11, the first passivation layer 13, the first antireflection layer 14, the second passivation layer 21, the second antireflection layer 22, and the electrode, the structural layer of the solar cell described in the present application further includes the N-type zinc oxide layer 12 made of the tetrapod-like N-type zinc oxide whisker powder as a raw material, for absorbing ultraviolet spectral energy; so that the absorbed ultraviolet spectral energy is converted into an external current through a PN junction of the silicon substrate layer 10 and the metal electrode. The tetrapod-like N-type zinc oxide whisker is a self-activated direct wide band gap inorganic semiconductor material with a lead-zinc ore structure, which has a regular three-dimensional spatial structure, a white loose powder appearance, and a three-dimensional microstructure, that is, the whisker has a core, and four needle-like crystals extend from radial directions of the core. It is currently the only material having a spatial three-dimensional structure among all whiskers. Due to their unique tetrapod-like three-dimensional structure, when applied in the field of solar cells, the tetrapod-like zinc oxide whiskers disperse in the matrix and then adjacent needle-like parts are overlapped with each other to form conductive pathways, thereby effectively endowing the material with conductivity and electrical transport performance. In addition, a spectral energy range of sunlight on the Earth is 200-2500 nm. The band gap of crystalline silicon in the existing solar cell is 1.12 eV, and the cut-off wavelength of light absorption is about 1100 nm; however, the absorption performance for ultraviolet light at 200-400 nm is poor, and mainly, a visible spectral region of 400-780 nm is absorbed, while the band gap of the N-type zinc oxide layer 12 in the present application is about 3.2 eV, and the cut-off wavelength of light absorption is about 400 nm. As can be seen, the absorption efficiency of the tetrapod-like N-type zinc oxide whisker in the present application for spectral energy is much higher than that of silicon in traditional solar cells. Through the above structural improvement, the solar cell described in the present application can not only absorb visible light at 400-780 nm, but also effectively absorb ultraviolet light at 200-400 nm. Additionally, an absorption rate of the solar cell described in the present application for light of 0.2-1 μm is greater than 90%, and therefore, compared with the existing silicon solar cells, the solar cell described in the present application significantly improves the photoelectric conversion rate of the solar cell.

As some optional implementations of the present application, the thickness of the N-type zinc oxide layer 12 is 0.1-50 μm.

In a specific application, a spectral energy range of sunlight on the Earth is 200-2500 nm. The band gap of crystalline silicon is 1.12 eV, and the cut-off wavelength of light absorption is about 1100 nm; however, the absorption performance for ultraviolet light at 200-400 nm is poor, and mainly, a visible spectral region of 400-780 nm is absorbed, while the band gap of the N-type zinc oxide layer 12 in the present application is about 3.2 eV, and the cut-off wavelength of light absorption is about 400 nm. High crystallinity zinc oxide is a prerequisite for effectively enhancing the absorption rate of the ultraviolet light at 200-400 nm. Therefore, in order to ensure the high crystallinity of the N-type zinc oxide layer 12, the thickness of the N-type zinc oxide layer 12 in the present application is 0.1-50 μm.

As some optional implementations of the present application, the front electrode 15 includes a silver gate electrode; and the back electrode 23 includes an aluminum gate electrode.

In specific applications, the electrode may be selected to be made of silver, aluminum, copper, gold, platinum, or other metals according to actual needs. The front electrode functions to remove electrons/holes moving to the front surface to form an external current and provide it to an external load. Due to the contact between the electrode and the silicon substrate layer, in order to reduce the series resistance, the electrode must have a good ohmic contact with the silicon substrate layer. In order to make it easier for electrons/holes moving to the front surface to reach an electrode end and then reduce the probability of electron/hole composite on the surface, the present application selects a silver gate electrode as the front electrode 15, which not only increases the area of the front electrode 15, but also ensures a good Ohmic contact with the silicon substrate layer through the excellent conductivity of silver. Similarly, the back electrode functions to remove electrons/holes moving to the back surface to form an external current and provide it to the external load. In addition, the back electrode 23 may further provide an electric field opposite to that of the front surface. In order to improve the open circuit voltage of the solar cell, the present application selects an aluminum gate electrode as the back electrode 23, so that in the electrode preparation process, aluminum atoms are introduced into the silicon substrate layer material as dopants, thereby forming a P-type heavily doped structure at an interface of the silicon substrate layer material. The surface of the silicon substrate layer forms good ohmic contact with the metal aluminum, so that it is easier for hole carriers to move into the back electrode. However, the present application aims to improve the conversion efficiency of the solar cell by forming a high potential barrier in a P+ region of the P-type silicon to avoid electrons in an incorrect transport direction from entering the back electrode.

As some optional implementations of the present application, the first antireflection layer 14 includes a silicon nitride antireflection layer; and the second antireflection layer 22 includes a silicon nitride antireflection layer.

In a specific application, the antireflection layer functions to reduce surface reflection of an incident light source on the substrate layer, thereby reducing the reflection loss of the light source. Therefore, the first antireflection layer 14 in the present application is preferably a silicon nitride antireflection layer, and the second antireflection layer 22 is preferably a silicon nitride antireflection layer. The thickness of the antireflection layer may be selected based on the wavelength of the antireflection light, for example, the optimal refractive index n and the thickness d of the antireflection layer should meet the following:

$$n = \sqrt{n_{si} n_0} \quad (1)$$

$$\lambda = 4nd \quad (2)$$

wherein, in the above Formula 1, $n_{si}$=3.5-6; $n_0$ is the refractive index of air, which is 1. $\lambda$ in the above Formula 2 is the wavelength of antireflection light.

The common reflection layer is mostly an insulating dielectric material. In addition to the silicon nitride described in the present application, it may also be a dielectric material such as titanium dioxide, aluminum trioxide, and silicon dioxide.

As some optional implementations of the present application, the first passivation layer 13 includes at least one of an aluminum oxide passivation layer and a silicon nitride passivation layer; and the second passivation layer 21 includes at least one of an aluminum oxide passivation layer and a silicon nitride passivation layer.

In a specific application, for a solar cell without a passivation layer, after photo generated carriers move to some high composite regions, if surfaces of the photo generated carriers do not come into contact with the electrode, they will be quickly composited, thereby seriously affecting the performance of the cell. Therefore, in order to improve the cell performance of the solar cell, a passivation layer is formed on both the front surface and the back surface of the substrate layer in the present application. The passivation layer may be obtained by diffusing silicon nitride, phosphorus, boron, and aluminum, and the passivation layer in the present application is preferably an aluminum oxide passivation layer and a silicon nitride passivation layer.

As some optional implementations of the present application, the diffusion layer 11 includes an N-type diffusion layer.

In a specific application, the diffusion layer 11 functions to form the simplest semiconductor device, and the selection of the diffusion layer material is greatly related to the formation and movement of electrons/holes under light conditions, then the formation and movement of electrons/holes under light conditions are also greatly related to the light absorption rate. Therefore, the N-type diffusion layer is preferred as the raw material for the diffusion layer in the present application.

To solve the above technical problem, the embodiments of the present application further provide a preparation method of the zinc oxide-crystalline silicon laminated solar cell, including the following steps:

diffusing a phosphorus impurity on a front surface of a P-type silicon substrate layer 10 to form a diffusion layer 11, and performing an edge insulation treatment; then magnetron sputtering tetrapod-like N-type zinc oxide whisker powder as a raw material on an upper surface of the diffusion layer to form an N-type zinc oxide layer 12, and forming a first passivation layer 13 and a first antireflection layer 14 on an upper surface of the N-type zinc oxide layer 12;

depositing a second passivation layer 21 and a second antireflection layer sequentially 22 on a back surface of the P-type silicon substrate layer 10;

screen printing a front electrode 15 on an upper surface of the first antireflection layer 14, and screen printing a back electrode 23 on a lower surface of the second antireflection layer 22; and using a sintering process so that the front electrode 15 and the back electrode 23 form ohmic contact with the P-type silicon substrate layer 10 to obtain the zinc oxide-crystalline silicon laminated solar cell.

In a specific application, the substrate layer is obtained by double-sided texturing after cleaning a silicon wafer. After obtaining the substrate layer, a diffusion layer 11 is formed on the front surface of the substrate layer to facilitate the formation and movement of electrons/holes under lighting conditions. The front electrode 15 and the back electrode 23 are used for removing the electrons/holes moving to the surface to form an external current and providing it to an external load. The first passivation layer 13 and the second passivation layer 21 are used for improving the cell performance of the solar cell, and the first antireflection layer 14 and the second antireflection layer 22 are used for reducing the reflection loss of light, thereby improving the light absorption rate of the solar cell.

In a specific application, a first passivation layer 13 and a first antireflection 14 layer are formed on the front surface of the second laminated cell to improve the cell performance of the solar cell. In a specific application, the tetrapod-like N-type zinc oxide whisker powder (hereinafter referred to as T-ZnOw) is a self-activated direct wide band gap inorganic semiconductor material with a lead-zinc ore structure, which has a regular three-dimensional spatial structure, a white loose powder appearance, and a three-dimensional microstructure, that is, the whisker has a core, and four needle-like crystals extend from radial directions of the core. It is currently the only material having a spatial three-dimensional structure among all whiskers. T-ZnOw, as an N-type semiconductor, is used in solar cells. Due to its unique tetrapod-like three-dimensional structure, when T-ZnOw is dispersed in a matrix, and then adjacent needle-like parts are overlapped with each other to form conductive pathways, thereby effectively endowing the material with conductivity and electrical transport performance. In addition, the present application improves the preparation process of T-ZnOw to improve the effective separation of photo generated electrons and holes, and expands the spectral response range. That is, the ion doping process is adopted, and the ion doping includes metal ion doping and non-metal ion doping. The non-metal ion doping is preferred, so as to introduce some impurity energy levels into the band gap of T-ZnOw through the non-metal ion doping process, allowing T-ZnOw to respond to photons with longer wavelength to expand the utilization range of T-ZnOw for light and become traps for electrons or holes, thereby extending the life of charge carriers. Thus, the objective of expanding the absorption spectrum range is achieved. In addition, a spectral energy range of sunlight on the Earth is 200-2500 nm. The band gap of crystalline silicon is 1.12 eV, and the cut-off wavelength of light absorption is about 1100 nm; however, the absorption performance for ultraviolet light at 200-400 nm is poor, and mainly, a visible spectral region of 400-780 nm is absorbed, while the band gap of the N-type zinc oxide layer in the present application is about 3.2 eV, and the cut-off wavelength of light absorption is about 400 nm. High crystallinity zinc oxide is a prerequisite for effectively enhancing the absorption rate of the ultraviolet light at 200-400 nm. Therefore, in order to ensure the high crystallinity of the N-type zinc oxide layer 12, the thickness of the N-type zinc oxide layer 12 in the present application is 0.1-50 μm.

In some embodiments, the diffusing the phosphorus impurity on the front surface of the P-type silicon substrate layer 10 to form the diffusion layer 11, and performing the edge insulation treatment; then growing the N-type zinc oxide layer 12 by using tetrapod-like zinc oxide whisker powder as the raw material on the upper surface of the diffusion layer 11, and sequentially forming a first passivation layer 13 and the first antireflection layer 14 on the upper surface of the N-type zinc oxide layer 12 comprises:
  diffusing the phosphorus impurity on the front surface of the P-type silicon substrate layer 10 to form the diffusion layer 11, and performing the edge insulation treatment; then growing the N-type zinc oxide layer 12 by magnetron sputtering the tetrapod-like N-type zinc oxide whisker powder as the raw material on the upper surface of the diffusion layer 11 and annealing the N-type zinc oxide layer 12, and then sequentially forming the first passivation layer 13 and the first antireflection layer 14 on the upper surface of the N-type zinc oxide layer 12.

Figure 1:
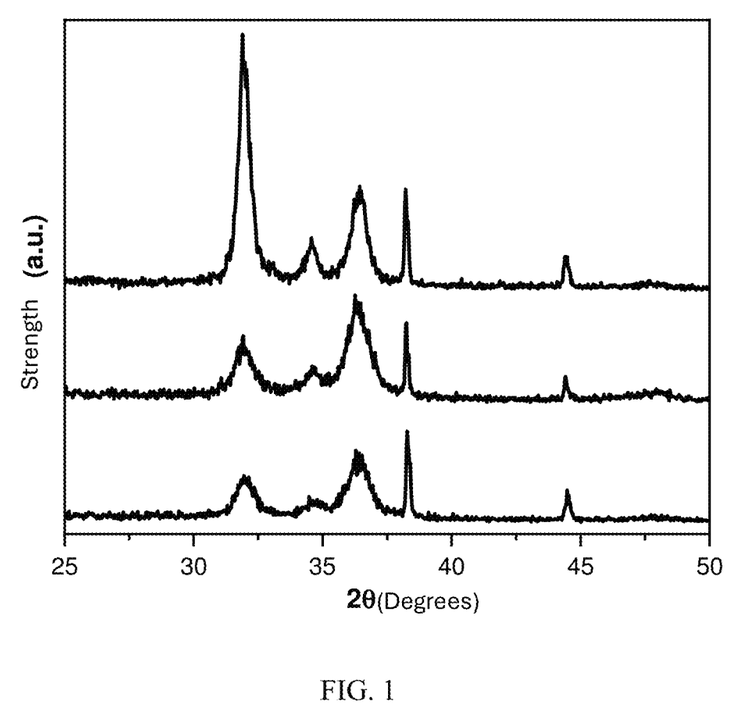
FIG. 1 is an XRD pattern of an N-type zinc oxide layer prepared by the magnetron sputtering method according to an embodiment of the present application.

The sputtering energy is 80-250 W, a pressure range of working gas argon is 0.4-1.6 Pa, and the sputtering time is 15-20 min when growing the N-type zinc oxide layer by magnetron sputtering the tetrapod-like N-type zinc oxide whisker powder as the raw material on the upper surface of the diffusion layer. As shown in FIG. 1, it is an XRD pattern of an N-type zinc oxide layer prepared by the magnetron sputtering method according to the present application with different process parameters. As can be seen from FIG. 1, the N-type zinc oxide layer prepared in the present application has a sharp polycrystalline diffraction peak, indicating that the N-type zinc oxide layer has good crystallinity.

In some embodiments, after the N-type zinc oxide layer is obtained by magnetron sputtering, in order to improve the quality of the N-type zinc oxide layer and match the lattice matching between the N-type zinc oxide layer and the substrate layer, the present application further performs annealing on an intermediate of the first laminated cell, the annealing temperature is 100-600° C., and the annealing time is 1-60 min. The annealing temperature is preferably 150-250° C.

Figure 2:
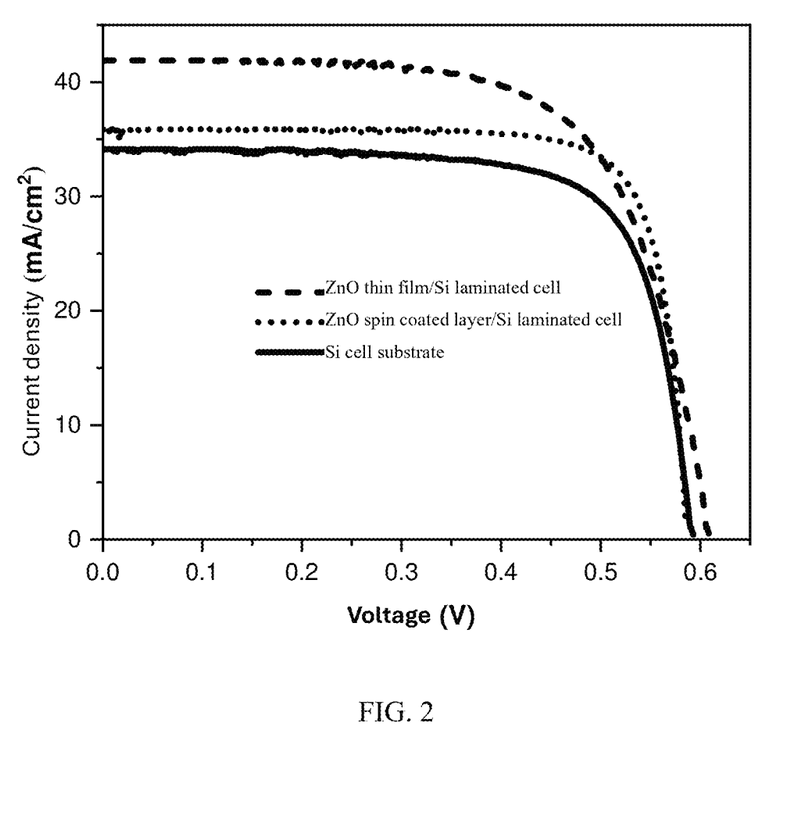
FIG. 2 is a diagram of comparison results of performing a photoelectric conversion rate test between the cell 1, the cell 2, and the existing silicon based solar cell according to an embodiment of the present application.

The N-type zinc oxide layer may be formed by the spin coating method in addition to the magnetron sputtering method. In the present application, N-type zinc oxide layer is formed on the front surface of the first laminated cell by the magnetron sputtering method and the spin coating method respectively, and the subsequent steps are the same, respectively, so as to obtain a cell 1 (magnetron sputtering method) and a cell 2 (spin coating method), and the photoelectric conversion rate test is performed on the cell 1, the cell 2, and an existing silicon based solar cell (referred to as a contrast cell in Table 1). The results are shown in FIG. 2 and Table 1:

TABLE 1

| Cell name | Photoelectric conversion rate |
|---|---|
| Cell 1 | 25%-26% |
| Cell 2 | 24%-25% |
| Contrast cell | 23% |

As can be seen, the photoelectric conversion rate of the existing silicon based solar cell (contrast cell) has reached about 23%, while the photoelectric conversion rate of the zinc oxide-crystalline silicon laminated solar cells (cells 1 and 2) mentioned in the present application may be increased by 1-3%, reaching 24%-26%.

In some embodiments, the tetrapod-like N-type zinc oxide whisker powder is prepared by the following steps: preheating montmorillonite to 500-1100° C., mixing it with a zinc raw material according to a mass ratio of (8-12):(2-5), and then placing the mixture in a reaction furnace for a non-metallic ion exchange reaction to obtain tetrapod-like N-type zinc oxide whisker powder. The purity content of the montmorillonite is more than 90%, and the purity content of the zinc raw material is more than 99%. A mixing mass ratio of the montmorillonite and the zinc raw material is preferably 3:10. The reaction temperature of the non-metallic ion exchange reaction is 600-1100° C., and the reaction time is 10-25 min; wherein oxygen and nitrogen are introduced into the reaction furnace when the reaction lasts for 7 min.

During preparation of the tetrapod-like zinc oxide, oxygen and nitrogen are charged into the reaction furnace when the montmorillonite is subjected to the non-metallic ion exchange reaction with the zinc raw material, and a volume ratio of oxygen and nitrogen is (2-5):(5-8). To better promote the exchange of non-metallic ions, the volume ratio of oxygen and nitrogen is preferably 4:6.

When preparing the tetrapod-like zinc oxide as described above, the non-metallic ion exchange reaction includes the following steps:
  mixing the preheated montmorillonite with the zinc raw material and placing the mixture in the reaction furnace, and heating to 600-700° C. to obtain dehydrated montmorillonite;
  heating to 800-935° C. to obtain montmorillonite with destroyed lattice;
  heating to 935-1,100° C. so that the montmorillonite with destroyed lattice is subjected to the non-metallic ion exchange reaction with the zinc raw material, and obtaining the tetrapod-like N-type zinc oxide whisker powder.

The existing zinc oxide material or zinc oxide doped with other metal elements is non-single crystal or needle-like zinc oxide formed by single-direction growing, and its structure has many defects, such as particle interface, dislocations, voids, and incomplete structure. While the tetrapod-like zinc oxide in the present application is different from the whisker-like single crystal grown in the form of single crystal, its atomic structure is arranged in a highly orderly manner during crystallization, and its diameter is too small to accommodate defects existing in a large crystal. In the technology, in the use, the montmorillonite catalyst plays a role in controlling the gas phase supersaturation, and increasing the zinc gas diffusion path and nucleation, so that there are fewer lattice defects, and the whisker growth is uniform and close to a theoretical value of perfect crystal. Therefore, the tetrapod-like zinc oxide in the present application has a band gap of about 3.2 eV, which can effectively absorb ultraviolet light with shorter wavelength in sunlight. However, the electrons and holes generated by it under ultraviolet excitation are easy to composite, because an electron orbital which is filled with electrons forms a valence band of the semiconductor, and an empty orbital which is not filled with electrons forms a conduction band of the semiconductor. There are no continuous electron energy levels in the semiconductor, and an empty energy level region between the valence band and the conduction band is referred to as a semiconductor band gap ($E_g$). Only when the energy of the incident light photons is equal to or greater than the band gap energy $E_g$, can the photons excite the electrons on the semiconductor valence band, causing them to transition from the valence band to the conduction band to form photo generated electrons, leaving holes (that is, photo generated holes) at the corresponding positions in the valence ban. The formed photo generated electron-hole pairs are charge carriers, and the carriers have a lifetime of nanoseconds. Therefore, the present application improves the preparation process of the tetrapod-like zinc oxide, that is, montmorillonite is used to exchange non-metallic ions with zinc oxide, so that through the non-metallic ion doping process, some impurity energy levels may be introduced into the band gap of T-ZnOw, and T-ZnOw may respond to photons with longer wavelength to broaden the light utilization region of T-ZnOw and become traps for electrons or holes, thus extending the life of carriers, so as to improve the effective separation of photo generated electrons and holes, and expand the spectral response range.

Figure 3:
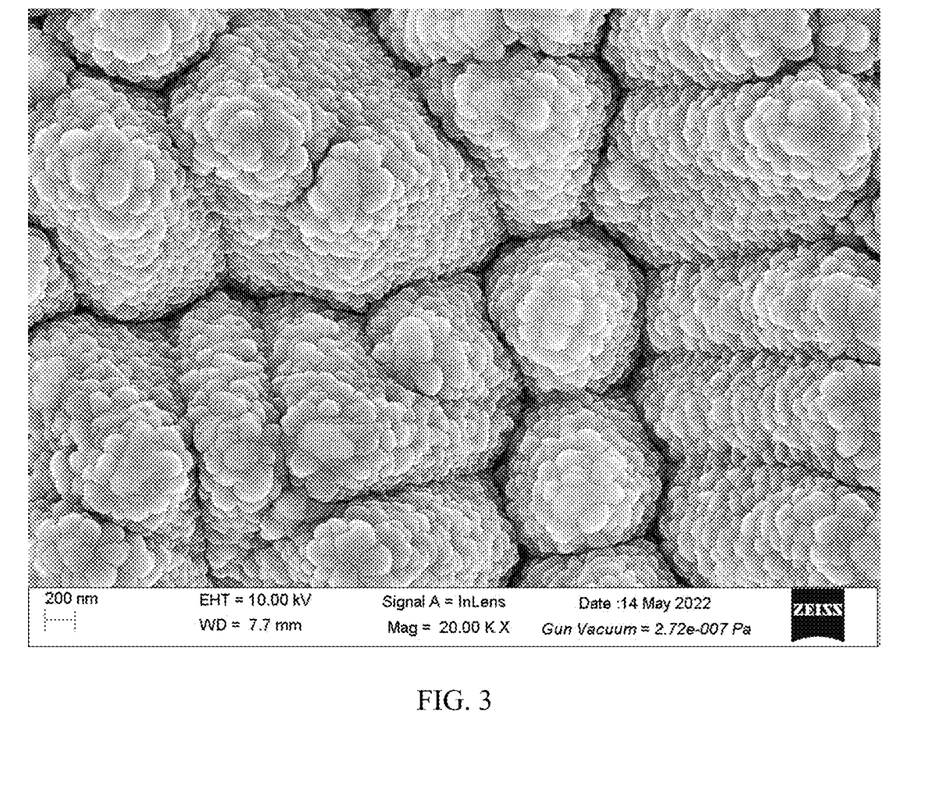
FIG. 3 is a top view of a surface morphology of the zinc oxide-crystalline silicon laminated solar cell according to an embodiment of the present application.
Figure 4:
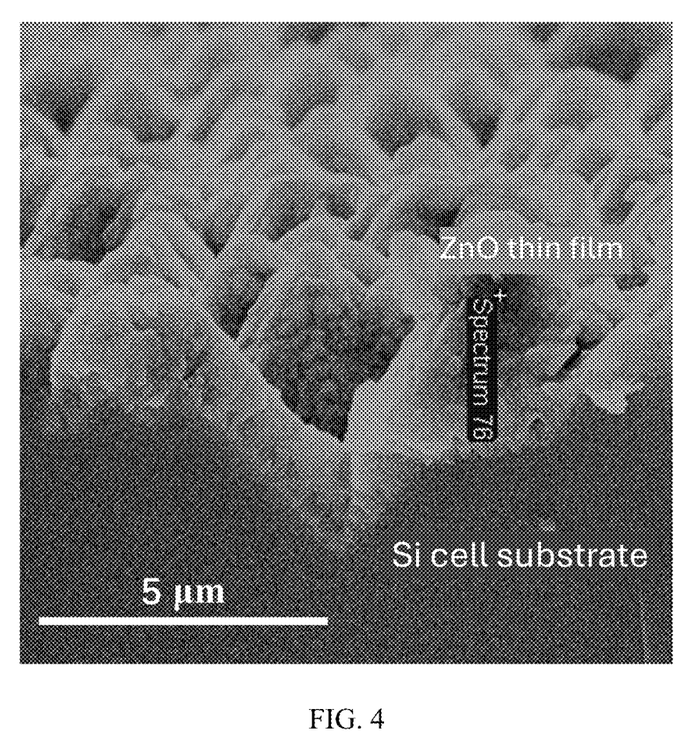
FIG. 4 is a side view of a surface morphology of the zinc oxide-crystalline silicon laminated solar cell according to an embodiment of the present application.

The zinc oxide-crystalline silicon laminated solar cell prepared by the above method is tested by using scanning electron microscopy (SEM), and the results are shown in FIG. 3 to FIG. 4. FIG. 3 shows a top view of the surface morphology of the zinc oxide-crystalline silicon laminated solar cell, and FIG. 4 shows a side view of the surface morphology of the zinc oxide-crystalline silicon laminated solar cell. As can be seen, the prepared tetrapod-like zinc oxide is granular, with a particle size of about 200 nm, uniformly covering an N-type silicon velvet surface. At the same time, the composition analysis of a ZnO layer is performed by using X-ray energy dispersive spectroscopy (EDS) of the SEM. The results are shown in Table 2, indicating that the prepared tetrapod-like zinc oxide conforms to a stoichiometric ratio.

TABLE 2

| Element | Weight percentage | Atomic percentage |
| --- | --- | --- |
| Oxygen | 20.67 | 50.96 |
| Zinc | 77.97 | 47.05 |
| Other | 1.36 | 1.99 |
| Total | 100.00 | 100 |

Figure 5:
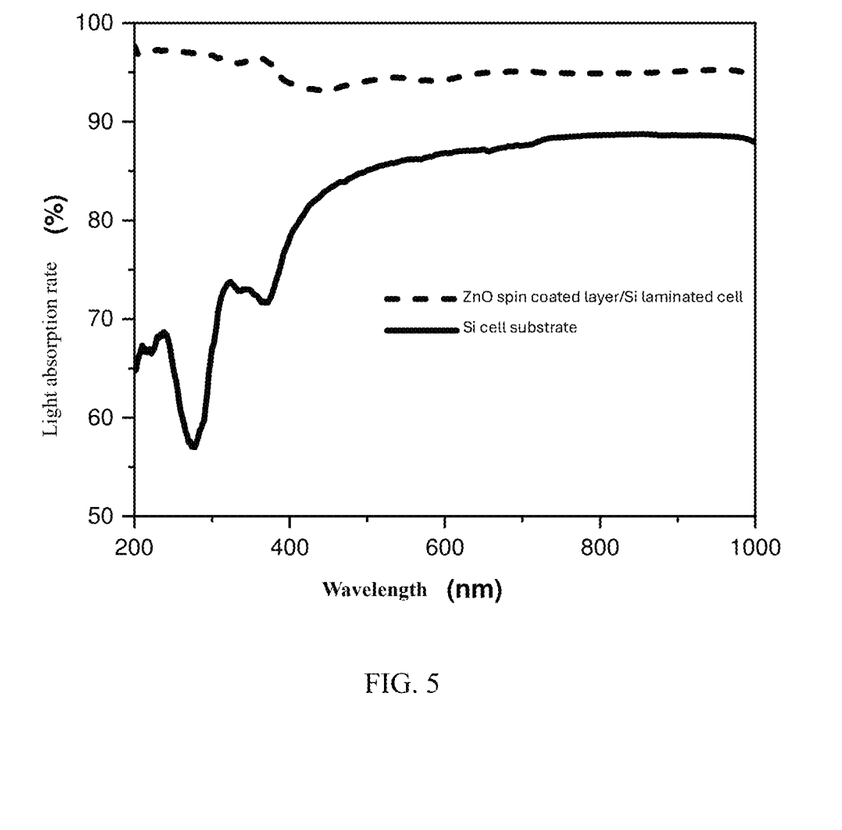
FIG. 5 is a comparison diagram of a light absorption rate between the zinc oxide-crystalline silicon laminated solar cell and the existing silicon-based solar cell according to an embodiment of the present application.

The zinc oxide-crystalline silicon laminated solar cell (referred to as cell 1 in Table 3) described in the present application is compared with the existing silicon based solar cell (referred to as contrast cell in Table 3) in terms of a light absorption rate for a spectrum of 200-1000 nm. The results are shown in FIG. 5 and Table 3:

TABLE 3

| Cell name | Light absorption rate for a spectrum of 200-1000 nm |
| --- | --- |
| Cell 1 | 93%-98% |
| Contrast cell | 57%-88% |

As can be seen, the zinc oxide-crystalline silicon laminated solar cell (cell 1) in the present application effectively enhances the absorption rate of ultraviolet light at 200-400 nm by adding a tetrapod-like N-type zinc oxide layer as the N-type zinc oxide layer. The zinc oxide-crystalline silicon laminated solar cell (cell 1) in the present application has a light absorption rate of over 93% at 200-1000 nm, especially enhancing the absorption rate of ultraviolet light at 200-400 nm, which is significantly improved compared with crystalline silicon cells.

The solar cell prepared by the method described in the above embodiment not only includes a substrate layer, a diffusion layer, a first passivation layer, a first antireflection layer, a second passivation layer, a second antireflection layer, and an electrode in the structural layer, but further includes a tetrapod-like N-type zinc oxide layer as an N-type zinc oxide layer for absorbing ultraviolet spectral energy; so that the absorbed ultraviolet spectral energy is converted into an external current through a PN junction of the silicon substrate layer and the metal electrode. In addition, a spectral energy range of sunlight on the Earth is 200-2500 nm. The band gap of crystalline silicon in the existing solar cell is 1.12 eV, and the cut-off wavelength of light absorption is about 1100 nm; however, the absorption performance for ultraviolet light at 200-400 nm is poor, and mainly, a visible spectral region of 400-780 nm is absorbed, while the band gap of the N-type zinc oxide layer in the present application is about 3.2 eV, and the cut-off wavelength of light absorption is about 400 nm. As can be seen, the absorption efficiency of the tetrapod-like zinc oxide in the present application for spectral energy is much higher than that of silicon in traditional solar cells. Through the above structural improvement, the solar cell described in the present application can not only absorb visible light at 400-780 nm, but also effectively absorb ultraviolet light at 200-400 nm. Additionally, an absorption rate of the solar cell described in the present application for light of 0.2-1 µm is greater than 90%, and therefore, compared with the existing crystalline silicon solar cell, the solar cell described in the present application significantly improves the photoelectric conversion rate of the solar cell.

Photovoltaic power generation can effectively utilize solar energy for energy storage and charging, which saves energy. Electric vehicles themselves have been included in development planning of China. If photovoltaic power generation and electric vehicle charging facilities can be organically integrated, and synergistic interaction may be achieved through optimized configuration and operation, which will promote the popularization of electric vehicles, reduce pollution, and promote social and economic progress. However, existing photovoltaic charging stations usually use existing solar cells, and therefore, the photoelectric conversion rate of solar energy is not high. On this basis, use of a zinc oxide-crystalline silicon laminated solar cell ad described above is further proposed in some embodiments of the present application, that is, the zinc oxide-crystalline silicon laminated solar cell is used for manufacturing a photovoltaic charging station. The specific structure of the above photovoltaic charging station is not limited in the present application, and may be the structure of an existing charging pile including, for example, a charging pile; a support frame located on the charging pile; and a disassembling and assembling assembly, the mounting and dismounting assembly being connected to the support frame for rapidly mounting and dismounting the photovoltaic panel on the support frame; wherein the mounting and dismounting assembly includes a compressing assembly and a buckling assembly, and the compressing assembly is mounted in coordination with the buckling assembly. For another example, the solar panel is arranged above the charging pile, the solar panel is connected to the charging pile through an adjusting mechanism, and the adjusting mechanism includes an electric push rod motor, a support rod, and a support base. The support base is respectively arranged on both sides of a back surface of the solar panel and both sides of the charging pile, the support rod has one end connected to the support base arranged on the back surface of the solar panel through a bearing, and the other end connected to the electric push rod motor through a bearing, and the electric push rod motor is fixed on the support base on both sides of the charging pile. A parking space is arranged on one side of the charging pile, and the parking space includes a parking space recognition apparatus used for identifying the electric vehicle, and the recognition apparatus includes a camera and an electric vehicle parking lock. The charging pile is internally provided with a photovoltaic controller, a central controller, a battery, and a detection module. A front surface of the charging pile is provided with a display screen. The photovoltaic controller is connected to the solar panel through a wire, and the battery is connected to the solar panel through the photovoltaic controller. The central controller is connected to control terminals of the electric push rod motor, the camera, and the electric vehicle position lock through wires. The central controller is connected to the detection module and display screen through wires, and a power terminal of the central controller is connected to the battery through a wire. Four corners at a top end of the solar panel are all provided with light sensors, and the light sensors are connected to the central controller through wires. For another example, a ceiling is arranged above a road surface or pedestrian bridge, and a photovoltaic charging pile is arranged on an upper surface of the ceiling to electrically connect the photovoltaic charging pile with the road surface or pedestrian bridge for charging an electric bicycle. The specific structure of the photovoltaic charging pile may be set according to actual needs, such as whether it is necessary to identify the parking space of the electric vehicle, or whether it is necessary to identify the angle of sunlight irradiation and then the corresponding structure can be set, which will not be elaborated here.

With the rapid development of the world economy and the widespread use of vehicles, most of which use non renewable energy sources such as gasoline and diesel, which causes increasingly serious air pollution. However, they directly or indirectly emit carbon dioxide. In order to alleviate environmental pollution, electric powered vehicles are commonly used in existing technologies. However, a battery of an electric powered vehicle is short in service cycle, requires to be frequently charged, and is poor in life and longer in the charging time, which is inconvenient for users, especially, if it is required to charge when the user is out, it is difficult to find a charging location. Therefore, the zinc oxide-crystalline silicon laminated solar cell described in the present application may also be used for manufacturing a photovoltaic-powered vehicle to improve their ranges. The photovoltaic-powered vehicle may be a photovoltaic-powered car, a photovoltaic-powered bicycle, a photovoltaic-powered motorcycle, a photovoltaic-powered flying vehicle, a photovoltaic-powered water vehicle, a photovoltaic-powered train, a photovoltaic-powered aircraft, and the like. Of course, the aforementioned photovoltaic-powered vehicles also include a photovoltaic-powered lunar rover in outer space such as the lunar surface.

The above descriptions are preferred embodiments of the present application, and are not intended to limit the scope of the present application. Any equivalent structure or equivalent flow variation made by using the description and accompanying drawings of the present application and applied directly or indirectly in other related technical fields shall all fall within the protection scope of the present application.

The invention claimed is:

1. A zinc oxide-crystalline silicon laminated solar cell, comprising: a P-type silicon substrate layer; a front surface of the P-type silicon substrate layer being sequentially formed with, from bottom to top, a diffusion layer, an N-type zinc oxide layer, a first passivation layer, and a first antireflection layer; wherein the N-type zinc oxide layer is made of tetrapod-like N-type zinc oxide whisker powder as a raw material; and a back surface of the P-type silicon substrate layer being sequentially formed with, from top to bottom, a second passivation layer and a second antireflection layer; and an electrode, the electrode comprising a front electrode and a back electrode, wherein the front electrode comprises a silver gate electrode; and the back electrode comprises an aluminum gate electrode, and wherein a thickness of the N-type zinc oxide layer is 0.1-50 μm, the first antireflection layer comprises a silicon nitride antireflection layer, and the second antireflection layer comprises a silicon nitride antireflection layer.

2. The zinc oxide-crystalline silicon laminated solar cell according to claim 1, wherein the first passivation layer comprises at least one of an aluminum oxide passivation layer and a silicon nitride passivation layer; and the second passivation layer comprises at least one of an aluminum oxide passivation layer and a silicon nitride passivation layer.

3. The zinc oxide-crystalline silicon laminated solar cell according to claim 1, wherein the diffusion layer comprises an N-type diffusion layer.

4. A method for preparing the zinc oxide-crystalline silicon laminated solar cell according to claim 3, comprising the following steps:
diffusing a phosphorus impurity on a front surface of a P-type silicon substrate layer to form a diffusion layer, and performing an edge insulation treatment; then magnetron sputtering tetrapod-like N-type zinc oxide whisker powder on an upper surface of the diffusion layer to form an N-type zinc oxide layer, and forming a first passivation layer and a first antireflection layer on an upper surface of the N-type zinc oxide layer;
depositing a second passivation layer and a second antireflection layer sequentially on a back surface of the P-type silicon substrate layer;
screen printing a first electrode on an upper surface of the first antireflection layer, and screen printing a second electrode on a lower surface of the second antireflection layer; and
using a sintering process so that the first electrode and the second electrode form ohmic contact with the P-type silicon substrate layer to obtain the zinc oxide-crystalline silicon laminated solar cell.

5. The method for preparing the zinc oxide-crystalline silicon laminated solar cell according to claim 4, wherein the diffusing the phosphorus impurity on the front surface of the P-type silicon substrate layer to form the diffusion layer, and performing the edge insulation treatment; then growing the N-type zinc oxide layer by using tetrapod-like zinc oxide whisker powder on the upper surface of the diffusion layer, and sequentially forming the first passivation layer and the first antireflection layer on the upper surface of the N-type zinc oxide layer comprises:

diffusing the phosphorus impurity on the front surface of the P-type silicon substrate layer to form the diffusion layer, and performing the edge insulation treatment; then growing the N-type zinc oxide layer by magnetron sputtering the tetrapod-like N-type zinc oxide whisker powder as a raw material on the upper surface of the diffusion layer and performing annealing treatment on the N-type zinc oxide layer, and then sequentially forming the first passivation layer and the first antireflection layer on the upper surface of the N-type zinc oxide layer.

6. The method for preparing the zinc oxide-crystalline silicon laminated solar cell according to claim 5, wherein sputtering energy is 80-250 W, an air pressure range of a working gas argon is 0.4-1.6 Pa, and sputtering time is 15-20 min when growing the N-type zinc oxide layer by magnetron sputtering the tetrapod-like N-type zinc oxide whisker powder as the raw material on the upper surface of the diffusion layer.

7. The method for preparing the zinc oxide-crystalline silicon laminated solar cell according to claim 5, wherein annealing temperature is 100-600° C., and annealing time is 1-60 min when performing the annealing treatment on the N-type zinc oxide layer.

8. The method for preparing the zinc oxide-crystalline silicon laminated solar cell according to claim 5, wherein the tetrapod-like N-type zinc oxide whisker powder is prepared by the following steps:

preheating montmorillonite to 500-1,100° C., mixing it with a zinc raw material according to a mass ratio of (8-12):(2-5), and then placing the mixture in a reaction furnace for a non-metallic ion exchange reaction to obtain the tetrapod-like N-type zinc oxide whisker powder.

9. The method for preparing the zinc oxide-crystalline silicon laminated solar cell according to claim 8, wherein oxygen and nitrogen are introduced into the reaction furnace when the montmorillonite is subjected to the non-metallic ion exchange reaction with the zinc raw material, and a volume ratio of the oxygen to nitrogen is (2-5):(5-8).

10. The method for preparing the zinc oxide-crystalline silicon laminated solar cell according to claim 9, wherein reaction temperature of the non-metallic ion exchange reaction is 600-1,100° C., and reaction time is 10-25 min; wherein oxygen and nitrogen are introduced into the reaction furnace when the reaction lasts for 7 min.

11. The method for preparing the zinc oxide-crystalline silicon laminated solar cell according to claim 10, wherein the non-metallic ion exchange reaction comprises the following steps:

mixing the preheated montmorillonite with the zinc raw material and then placing the mixture in the reaction furnace, and heating to 600-700° C. to obtain dehydrated montmorillonite;

heating to 800-935° C. to obtain montmorillonite with destroyed lattice;

heating to 935-1,100° C. so that the montmorillonite with destroyed lattice is subjected to the non-metallic ion exchange reaction with the zinc raw material to obtain the tetrapod-like N-type zinc oxide whisker powder.

12. Use of the zinc oxide-crystalline silicon laminated solar cell according to claim 3, wherein the zinc oxide-crystalline silicon laminated solar cell is used for manufacturing a photovoltaic charging station.

13. Use of the zinc oxide-crystalline silicon laminated solar cell according to claim 3, wherein the zinc oxide-crystalline silicon laminated solar cell is used for manufacturing a photovoltaic powered vehicle.

\* \* \* \* \*